United States Patent
Honda et al.

(10) Patent No.: US 6,268,323 B1
(45) Date of Patent: *Jul. 31, 2001

(54) NON-CORROSIVE STRIPPING AND CLEANING COMPOSITION

(75) Inventors: Kenji Honda, Barrington, RI (US); Richard Mark Molin, Phoenix; Gale Lynne Hansen, Chandler, both of AZ (US)

(73) Assignee: Arch Specialty Chemicals, Inc., Norwalk, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/135,809

(22) Filed: Aug. 18, 1998

Related U.S. Application Data

(63) Continuation-in-part of application No. 08/850,991, filed on May 5, 1997, now Pat. No. 5,798,323.

(51) Int. Cl.$^7$ .............................. C11D 7/26; C11D 7/32; C11D 7/50
(52) U.S. Cl. .................. 510/176; 510/175; 510/203; 510/206; 510/210; 510/212; 510/434; 510/499; 510/500
(58) Field of Search ..................... 510/175, 176, 510/203, 206, 210, 212, 434, 499, 500

(56) References Cited

U.S. PATENT DOCUMENTS

| | | | | |
|---|---|---|---|---|
| 4,617,251 | * | 10/1986 | Sizensky | 430/256 |
| 5,011,621 | * | 4/1991 | Sullivan | 252/162 |
| 5,454,985 | * | 10/1995 | Harbin | 252/558 |
| 5,563,119 | * | 10/1996 | Ward | 510/176 |
| 5,597,678 | * | 1/1997 | Honda et al. | 430/331 |
| 5,753,601 | * | 5/1998 | Ward et al. | 510/176 |
| 5,759,975 | * | 6/1998 | Maxwell | 510/203 |
| 5,795,702 | * | 8/1998 | Tanabe et al. | 430/331 |
| 5,798,323 | * | 8/1998 | Honda et al. | 510/176 |

OTHER PUBLICATIONS

Budavaria, Susan, The Merck Index, pp. 766–767, 1989.*

* cited by examiner

*Primary Examiner*—Mark Kopec
*Assistant Examiner*—Brian P. Mruk
(74) *Attorney, Agent, or Firm*—Ohlandt, Greeley, Ruggiero & Perle, LLP

(57) ABSTRACT

A non-corrosive photoresist stripping and cleaning composition, comprising:
  (a) about 5% to about 50% of a solvent;
  (b) about 10% to about 90% of an alkanolamine;
  (c) about 0.1 to 10 % of a carboxylic acid; and
  (d) about 1.0% to 40% of water.

5 Claims, No Drawings

NON-CORROSIVE STRIPPING AND CLEANING COMPOSITION

This is a Continuation-In-Part of U.S. patent application Ser. No. 08/850,991, filed May 5, 1997 U.S. Pat. No. 5,798,323.

The present invention relates to a non-corrosive photoresist stripping and cleaning composition containing a combination of certain percentages of (1) selected solvents; (2) selected alkanolamine compounds; (3) selected corrosion inhibitors; and (4) water.

BACKGROUND OF THE INVENTION

The photoresist stripper/plasma etch residue cleaner art is replete with numerous references to compositions containing either a polar solvent or an alkanolamine compound, or both. The presence of an alkanolamine in photoresist stripper compositions has been judged to be essential to effectively remove cross-linked resist films. However, alkanolamine-type photoresist strippers sometimes have a serious problem of corrosion, especially with aluminum substrates.

It is believed that the corrosion is caused in part by the ionization of water with the alkanolamine in post-stripping water rinse, as residual stripper solution may be retained on the substrate surface and/or substrate carrier after the stripping step. In other words, the alkanolamine component of the stripper composition does not corrode the substrate by itself, but can trigger water to cause the corrosion.

To solve this problem, an intermediate rinse step with an organic solvent (e.g., isopropyl alcohol) has been used between the stripping step and the post-stripping rinse with water. However, such intermediate rinses are not necessarily desirable because overall stripping operation becomes more complicated and, furthermore, an additional solvent waste is produced. Accordingly, if alkanolamine-containing strippers are to be further employed, there is a need to solve this corrosion problem without generation of intermediate organic solvent wastes.

In addition, other mechanisms of metal corrosion are known. For example, metal halides, such as aluminum chloride, tend to be generated as plasma-etch by-products. Metal halides may cause corrosion of substrates when contacted with water from a water rinse following the cleaning process. Another corrosion mechanism is observed especially with alloys such as Al—Cu—Si during cleaning or in a post-clean rinse process. This type of corrosion is usually observed locally and is referred to as pitting. Pitting is thought to be caused by the galvanic type of the electrochemical reaction between two metals which have different electronegativities.

The present invention provides a solution for all the above-described types of corrosion.

Furthermore, during anisotropic plasma etching processes for via contacts, metal patterns, and passivation openings, "sidewall residues" are frequently deposited on the resist sidewall. After the oxygen plasma ashing of photoresist films, these residues become metal oxides. Incomplete removal of these residues interfere with the pattern definition and/or complete filling of via holes.

Several different chemistries have been identified for removing the post-etch residues, particularly the metal oxide type. For example, alkaline aqueous developers such as those containing tetramethylammonium hydroxide (TMAH) are known to attack aluminum. Thus, an aluminum oxide residue can be etched away with TMAH. However, other types of the post-etch residues associated with multi-metal systems such as Al—Si—Cu cannot be so easily removed with TMAH. TMAH also is ineffective on residues formed from polysilicon plasma etch processes.

The metal oxide type sidewall residues can also be removed with: (1) a mixture of hydrofluoric acid and ethylene glycol ether, or (2) a mixture of nitric acid, acetic acid, and hydrofluoric acid. These solutions require extreme process control to prevent excessive attack of critical metal and oxide layers. In some device structures, these solutions are not useful because of their nonselective attack mechanisms.

Wai M. Lee described at Interconnects, Contact Metallization and Multilevel Metallization Symposium (183rd Spring Meeting of The Electrochemical Society) in Honolulu, HI, May 16–21, 1993, that a hydroxylamine-containing amine/water-based stripper composition can remove some kinds of the sidewall residues. Although hydroxylamine has a potential to enhance the stripper ability and/or the metal corrosion inhibition, it is not stable upon heating. Therefore, the use of hydroxylamine is not recommended, especially when used in a highly alkaline medium.

Accordingly, hydroxylamine is not suitable for use in stripping of photoresist films or cleaning of the post-etch residues at higher temperatures.

Illustrative of references suggesting photoresist stripping or plasma-etch residue cleaning compositions containing a polar solvent and/or an alkanolamine compound are the following:

U.S. Pat. No. 4,617,251, which issued to Sizensky et al. on Oct. 14, 1986, teaches a positive photoresist stripping composition containing: (A) selected amine compound (e.g., 2-(2-aminoethoxy) ethanol, 2-(2-aminoethylamino)ethanol, and mixtures thereof) and (B) selected polar solvents (e.g., N-methyl-2-pyrrolidinone, tetrahydrofurfuryl alcohol, isophorone, dimethyl sulfoxide, dimethyl adipate, dimethyl glutarate, sulfolane, gamma-butyrolactone, N,N-dimethylacetamide and mixtures thereof). The reference further teaches that water as well as dyes or colorants, wetting agents, surfactants and antifoamers may be added into this composition.

U.S. Pat. No. 5,279,791, which issued to Lee on Jan. 18, 1994, teaches a stripping composition for removing resists from substrates containing (A) hydroxylamine (e.g., $NH_2OH$); (B) at least one alkanolamine; and optionally (C) at least one polar solvent.

European Patent Application No. 647884 assigned to J.T. Baker Inc. discloses nonaqueous photoresist stripper composition comprising (i) a stripping solvent (e.g. N-methyl-2-pyrrolidinone), (ii) a nucleophilic amine (e.g., monoethanolamine), and (iii) a reducing agent such as salicyl aldoxime, gallic acid, and gallic acid esters.

European Patent Application No. 596515 assigned to JT Baker, Inc. discloses an alkaline photoresist stripping composition comprising a solvent, a nucleophilic amines (e.g., 1-amino-2-propanol, 2-aminoethanol), and a non-nitrogen containing weak acid German Published Patent Application No. DE3828513, which issued to Schulz on Mar. 1, 1990, teaches a positive and negative photoresist stripper composition containing (A) an aprotic polar solvent (e.g., 1,3-dimethyl-2-imidazolidinone or 1,3-dimethyl-tetrahydropyrimidinone); and (B) an organic base (e.g., alkanolamine).

Japanese Published Patent Application No. 1-081949, which issued to K. Matsumoto (Asahi Chemical) on Mar. 28, 1989, teaches a positive-working photoresist stripper composition containing (A) gamma-butyrolactone, N-methylformamide, N,N-dimethylformamide, N,N-dimethylacetamide or N-methyl-2-pyrrolidinone; (B) an amino alcohol (e.g., N-butyl-ethanolamine and N-ethyldiethanolamine); and (C) water.

Japanese Published Patent Application No. 4-350660, which issued to H. Goto et al. (Texas Instruments, Japan and Kanto Chemical, Inc.) on Dec. 4, 1992, teaches a stripper for positive photoresists comprising (A) 1,3-dimethyl-2-imidazolidinone, (B) dimethylsulfoxide and (C) a water-soluble amine (e.g., monoethanolamine or 2-(2-aminoethoxy)ethanol wherein the amount of the water-soluble amine is 7–30% by weight.

Japanese Published Patent Application No. 7-271057, which was published on Oct. 20, 1995, and is assigned to Tokyo Ohka Kogyo, teaches positive photoresist compositions that contain N,N-diethylhydroxyamine. Preferred formulations also contained either alkanolamines (e.g., monoethanolamine); water-miscible organic solvents (e.g. N-methyl-2-pyrrolidinone); water; additives (e.g., hydroxy aromatic compounds or triazole compounds); or carboxylic group-containing organic compounds, or certain combinations thereof. Salicyl alcohol is one of the preferred hydroxy aromatic compounds.

Japanese Published Patent Application No. 7-271057 does suggests the addition of carboxylic acid to an admixture of a water-miscible polar solvent and an alkanolamine for the application to photoresist stripping composition or plasma-etch residue cleaning composition. However, that reference requires the presence of a hydroxylamine compound, N,N-diethylhydroxylamine (DEHA), to achieve its desired performance.

Likewise European Patent Application No. 596515 does discloses an admixture of a solvent, an alkanolamine and a non-nitrogen containing weak acid in its formulation. However, this composition does not contain water which is essential in the removal of some kinds of plasma etch residues.

The stripping and cleaning composition of the present invention, on the other hand, is effective in removing a wide variety of both organic polymeric materials and plasma-etch residues. The inventor has found that some types of corrosion inhibitors can prevent metal corrosion without any reduction in the stripping rate of photoresist, or any reduction in the effectiveness of removing plasma etch residues. The present formulation provides a superior balance of various functional and economic requirements, including excellent prevention of metal contamination of substrate surfaces, and favorable material cost for the desired corrosion inhibition effect.

SUMMARY OF THE INVENTION

The present invention is directed to a non-corrosive stripping and cleaning composition which is free of hydroxylamine and its derivatives, this composition comprises:

(a) about 5% to 50% of a solvent selected from the group consisting of: N-methyl-2-pyrrolidinone, N-hydroxyethyl-2-pyrrolidinone, 1,3-dimethyl-2-imidazolidinone, dimethylsulfoxide, N,N-dimethylacetamide, sulfolane, diacetone alcohol, ethylene glycol, propylene glycol and admixtures thereof;

(b) about 10% to 90% of an alkanolamine selected from the group consisting of: diethyleneglycolamine, monoethanolamine, diethanolamine, triethanolamine, 2-(2-aminoethylamino)ethanol, and admixtures thereof;

(c) about 0.1% to 10% of a carboxylic acid type corrosion inhibitor, the carboxylic acid type corrosion inhibitor being selected from the group consisting of: formic acid, acetic acid, propionic acid, valeric acid, isovaleric acid, oxalic acid, malonic acid, succinic acid, glutaric acid, maleic acid, furmaric acid, phthalic acid, 1,2,3-benzene-tricarboxylic acid, glycolic acid, lactic acid, citric acid, salicylic acid, tartaric acid, gluconic acid, and combinations thereof; and (d) about 1% to 40% of water.

All percentages above are by weight of the total weight of the stripping and cleaning composition.

DESCRIPTION OF THE PREFERRED EMBODIMENTS

As defined herein, the term "non-corrosive" refers to suppression of any chemical action that gradually wears away a substrate. The term "stripping and cleaning composition" refers to a composition that is able to both (1) remove or strip a photoresist (or other similar organic polymeric material) film or layer from a substrate, and (2) remove or clean various types of plasma-etch residues (also sometimes called plasma sidewall polymers) from a substrate.

As stated above, the non-corrosive stripping and cleaning composition of the present invention has four components, namely, one or more selected polar solvents, one or more selected alkanolamine compounds, one or more selected corrosion inhibitors; and water. These four components must be present in certain percentages. Also, the present invention is preferably free of hydroxylamine compounds and its derivatives such as N,N-diethylhydroxylamine.

Solvents used in the stripping and cleaning composition of the invention include N-methyl-2-pyrrolidinone (NMP), N-hydroxyethyl-2-pyrrolidinone (HEP), 1,3-dimethyl-2-imidazolidinone (DMI), dimethylsulfoxide (DMSO), N,N-dimethylacetamide (DMAC), sulfolane, diacetone alcohol (DAAL), ethylene glycol (EG), propylene glycol (PG) or combinations thereof. NMP and HEP are the preferred solvents. These solvents are effective in stripping various types of photoresist.

Especially desirable is an admixture of HEP and NMP wherein the mixing ratio of HEP to NMP, by weight % is from about 10:90% to 90:10%, as HEP is a safer and more viscous solvent, while NMP is a more powerful stripping solvent with low viscosity. In general, the stripping power is increased by lowering the viscosity of a stripper solution.

Alkanolamines are also included in the stripping and cleaning composition, as mentioned above. Preferred alkanolamines include diethyleneglycolamine (DEGA), monoethanolamine (MEA), diethanolamine (DEA), triethanolamine (TEA), 2-(2-aminoethylamino)ethanol and admixtures thereof. MEA is especially preferred.

Corrosion inhibitors useful in the present invention are carboxylic acid compounds. Preferred carboxylic acid compounds are: formic acid, acetic acid, propionic acid, valeric acid, isovaleric acid, oxalic acid, malonic acid, succinic acid, glutaric acid, maleic acid, furmaric acid, phthalic acid, 1,2,3-benzene-tricarboxylic acid, glycolic acid, lactic acid, citric acid, salicylic acid, tartaric acid, gluconic acid, and combinations thereof. More preferred carboxylic acid type corrosion inhibitors are lactic acid, citric acid, succinic acid, salicyclic acid, phthalic acid, tartaric acid, and gluconic acid. This family of compounds has been found to effectively inhibit the corrosion without any reduction of the stripping power especially in combination with admixtures of all polar solvents, alkanolamines and water as described above.

These compounds provide a superior balance of various functional and economic requirements, including excellent prevention of metal contamination of substrate surfaces, and favorable material cost for the desired corrosion inhibition effect.

The fourth critical ingredient is water. Water increases the cleaning power when the composition of the invention is used as a cleaner of post-plasma etch residue.

Optional ingredients in the stripping and cleaning composition of the invention include water-soluble surface-active agents. Exemplary surface-active agents include poly (ethylene oxide) condensates with fatty alcohols manufactured by Olin Corporation of Norwalk, CT under the trade name of "POLY-TERGENT® CS-1".

The preferred amounts of these ingredients are about 8–40% polar solvent; about 20–80% amine compound; about 1 to 10% corrosion inhibitor; 5–35% water; and, if used, 0.01–2% surface-active compound; all based on the weight of the stripping and cleaning composition. The more preferred amounts of these ingredients are about 10–35% polar solvent; about 30–70% amine compound; about 3 to 7% corrosion inhibitor; about 10–30% water; and optionally about 0.05–1% surface-active compound; all based on the weight of the total composition.

Various other ingredients known to those skill in the art may optionally be included in the stripping and cleaning composition, e.g., dyes or colorants, wetting agents, antifoamers and so forth. Generally, the amount of each of these other optional ingredients would be about 0.01–0.5% by weight, based on the total composition.

The stripping and cleaning composition of the invention is prepared by dissolving one or more selected corrosion inhibitors with one or more selected solvents and one or more selected alkanol compounds at room temperature. As indicated above, optional ingredients may also be added.

One function of the described stripping and cleaning composition is removal or stripping of organic polymeric material from a substrate. This aspect of the invention is carried out by contacting an organic polymeric material such as a photoresist film with the described stripping and cleaning composition. The above-described composition may also be used in removing post-plasma etch by-products after plasma etching of a metallized wafer. These plasma-etch by-products are, for example, oxides or halides of aluminum, titanium, copper or related metals, such as, $AlCl_3$, $AlF_3$, $Al_2O_3$, $SiF_4$, $SiO_2$ and the like. This aspect of the invention is carried out by contacting the plasma-etch residues with the described cleaner solution. The actual conditions, i.e., temperature, time, and the like, may vary over wide ranges and are generally dependent on the nature and thickness of the organic polymeric material or plasma-etch residue to be removed, as well as other factors familiar to those skilled in the art. In general, however, temperatures ranging from about 45° C. to 90° C. for a period of about 5 minutes to 40 minutes are typical.

A variety of means can be employed in contacting the organic polymeric material and/or plasma-etch residues with the stripping and cleaning composition in the practice of the invention. For example, the substrate containing the organic polymeric material and/or plasma-etch residue can be immersed in a stripping and cleaning bath or the stripping and cleaning composition can be sprayed over the surface of the organic polymeric material, as well as plasma-etch residues, as will be apparent to those skilled in the art.

The stripping and cleaning composition of the invention is effective in removing a wide variety of organic polymeric materials and plasma-etch residues from substrates. Exemplary organic polymeric materials include positive- and negative- working g-line, i-line and deep UV resists, electron beam resists, X-ray resists, ion beam resists, as well as organic dielectric materials such as polyimide resins, and so forth. Specific examples of organic polymeric materials which can be removed in the practice of the invention include positive resists containing phenol-formaldehyde resins or poly(p-vinylphenol), negative resists containing cyclized polyisoprene, or poly (p-vinylphenol); and polymethylmethacrylate-containing resists. In particular, the stripping and cleaning composition has been found to be highly effective in removing positive resists containing a novolak resin and a diazonathoquinone type sensitizer, e.g., ortho naphthoquinone diazide sulfonic acid ester. Resists of this type include HPR 204 Series POSITIVE RESIST, HPR 504 Series POSITIVE RESIST, OiR32 Series POSITIVE RESIST, and HPR 6500 Series POSITIVE RESIST, sold by Olin Microelectronic Materials, of Norwalk, Conn.. The organic polymeric material residues can be removed from any of the conventional substrates known to those skilled in the art, such as silicon, silicon dioxide, silicon nitride, polysilicon, aluminum, aluminum alloys, copper, copper alloys, polyimides, and so forth.

The present invention is further described in detail by means of the following examples. All parts and percentages are by weight and all temperatures are degrees Celsius unless explicitly stated otherwise.

EXAMPLE 1

A stripping/cleaning solution was prepared by mixing 30.0 g of N-methyl-2-pyrrolidinone (NM), 55.0 g of monoethanolamine (MEA), 5.68 g of 88wt. % of lactic acid (LA) solution in water, and 9.32 g of deionized water with stirring to produce a clear solution. The ratio by weight of the components in the resulting solution was $NMP/MEA/H_2O/LA=30.0/55.0/10.0/5.0$. The pH of the solution was 11.8.

Silicon wafers which have a multi-layer of Al—Cu—Si/SiO2/Si were prepared by plasma deposition method and further top-coated with a positive photoresist (PR) at a film thickness of 1.0 micron by spin coating method. Micropatterning was applied to the PR layer photolithographically, followed by pattern transfer onto the metal layer by plasma etching with the prepatternized PR mask. Thus obtained wafers contained both residues of PR and plasma etching by-products which were a mixture of silicon and aluminum oxides and halides. The composition of the resulting plasma-etch residues (PER) were characterized by x-ray spectroscopy.

The wafers obtained were cut into 1 cm×1 cm pieces and placed in a 200 ml beaker which contained 100 ml of the above-mentioned stripping/cleaning solution in a temperature-controlled bath at 70° C. The pieces of wafer were immersed in the solution with gentle agitation for 30 minutes. The wafer pieces were transferred to another beaker that contained deionized water at room temperature and gently stirred for 5 minutes. The wafer pieces were then removed from the water and dried by blowing nitrogen gas onto the surface of the wafer pieces.

The wafer pieces were inspected under a scanning electron microscope (SEM) after gold sputtering. Top-down and cross-section views of the wafer SEM pictures were obtained to visualize the residue of PR and PER on the wafers. In addition, the exposed metal layer surface was inspected under SEM to evaluate any corrosion of the metal surface.

The SEM inspection results indicated that the present formulation of NMP/MEA/H$_2$O/LA=30/55/10/5 removed both residues of PR and PER without metal corrosion even if the post-strip intermediate rinse with an organic solvent such as isopropyl alcohol (IPA) was not applied.

EXAMPLES 2–3

Examples 2–3 illustrate additional compositions tested with admixtures of the same solvent, alkanolamine, water and lactic acid at different concentrations. Detailed formulations are summarized in Table 1 with the SEM inspection of each result.

CONTROL 1

In addition to Examples 1–3, a control formulation that contained no corrosion inhibitor was prepared as follows: NMP/MEA/H$_2$O=35/55/10. The strip test condition was the same as described in Example 1.

The SEM inspection result showed that both residues of PR and PER were completely removed as shown in Example 1. However, the metal layer was severely corroded in comparison to the formulations of Examples 1–3.

CONTROL 2

In addition to control 1, another control formulation that did not contain water was prepared as follows: NMP/MEA/LA=35/60/5. The strip test condition was the same as described in Example 1.

The SEM inspection showed that while PR residue was completely removed, the formulation without water did not remove the plasma-etch residues. Also, as shown in Table 1, no metal corrosion was observed with this formulation.

Table 1 below shows the results of the different formulations and their affect on stripping of the Photoresist (PR), Plasma Etch Residues cleaning (PER) and Corrosion inhibition (CIN).

TABLE 1

| | Formulation (Wt. %) | | | | Performance | | |
|---|---|---|---|---|---|---|---|
| Example | NMP | MEA | H$_2$O | LA | PR | PER | CIN |
| 1 | 30 | 55 | 10 | 5 | +++ | +++ | +++ |
| 2 | 34 | 55 | 10 | 1 | +++ | +++ | + |
| 3 | 32 | 55 | 10 | 3 | +++ | +++ | + |
| Control 1 | 35 | 55 | 10 | 0 | +++ | +++ | − |
| Control 2 | 35 | 60 | 0 | 5 | +++ | − | +++ |

+++ is highest score, and − is negative effect

The following conclusions may be drawn from the result shown in Table 1:

(1) The addition of lactic acid to the mixture of solvent, alkanolamine and water is essential to prevent the metal corrosion without any drawback of the performance of the photoresist stripping and plasma-etch residue cleaning;

(2) There is a concentration dependency of lactic acid on the corrosion inhibition. In other words, there should be an optimum concentration of lactic acid to make the best balance of the corrosion inhibition vs. the residue removal; and (3) The absence of water with the mixture of solvent, alkanolamine and lactic acid results in the incomplete removal of the plasma-etch residues.

While the invention has been described above with reference to specific embodiments thereof, it is apparent that many changes, modifications, and variations can be made without departing from the inventive concept disclosed herein. Accordingly, it is intended that the present invention embrace all such changes, modifications, and variations that fall within the spirit and broad scope of the appended claims.

What is claimed is:

1. A non-corrosive stripping and cleaning composition, which is free of hydroxylamine and its derivatives, comprising:

(a) about 5% to 50% by weight of a solvent selected from the group consisting of: N-methyl-2-pyrrolidinone, N-hydroxyethyl-2-pyrrolidinone, 1,3-dimethyl-2-imidazolidinone, dimethylsulfoxide, N,N-dimethylacetamide, sulfolane, diacetone alcohol, ethylene glycol, propylene glycol and admixtures thereof;

(b) about 10% to 90% by weight of an alkanolamine selected from the group consisting of: diethyleneglycolamine, monoethanolamine, diethanolamine, triethanolamine, 2-(2-aminoethylamino) ethanol, and admixtures thereof;

(c) about 0.1% to 10% by weight of a carboxylic acid corrosion inhibitor selected from the group consisting of: formic acid, acetic acid, propionic acid, valeric acid, isovaleric acid, oxalic acid, malonic acid, succinic acid, glutaric acid, maleic acid, furmaric acid, phthalic acid, 1,2,3-benzene-tricarboxylic acid, glycolic acid, lactic acid, citric acid, salicylic acid, tartaric acid, gluconic acid, and combinations thereof; and (d) about 1% to 40% by weight of water.

2. The non-corrosive stripping and cleaning composition of claim 1, wherein said solvent is present in the range between about 8–40%, said alkanolamine is present in the range between about 20–80%, said corrosion inhibitor is present in the range between about 1 to 10%, and said water is present in the range between about 5–35%.

3. The non-corrosive stripping and cleaning composition of claim 1, wherein said solvent is present in the range between about 10–35%, said alkanolamine is present in the range between about 30–70%, said corrosion inhibitor is present in the range between about 3 to 7%, and said water is present in the range between about 10–30%.

4. The non-corrosive stripping and cleaning composition of claim 1, further comprising about 0.01% to 2% by weight of a surface-active compound.

5. A non-corrosive stripping and cleaning composition, which is free of hydroxylamine and its derivatives, comprising:

(a) about 8–40% by weight N-methyl-2-pyrrolidinone;

(b) about 20–80% by weight monoethanolamine;

(c) about 3 to 7% by weight lactic acid; and (d) about 5–35% water.

* * * * *